United States Patent
Pan et al.

[11] Patent Number: 5,930,430
[45] Date of Patent: Jul. 27, 1999

[54] INTEGRATED LASER DIODE AND FIBER GRATING ASSEMBLY

[75] Inventors: Jing-Jong Pan, Milpitas; Paul She-Qi Jiang, San Jose; Yuan Shi, San Jose; Li-Hua Wang, San Jose; Ming Shih, Milpitas, all of Calif.

[73] Assignee: E-Tek Dynamics, Inc., Milpitas, Calif.

[21] Appl. No.: 08/909,163

[22] Filed: Aug. 11, 1997

Related U.S. Application Data

[63] Continuation of application No. 08/640,375, Apr. 2, 1997, Pat. No. 5,717,804.

[51] Int. Cl.$^6$ ........................................ G02B 6/36
[52] U.S. Cl. ........................ 385/94; 385/37; 385/92; 385/88
[58] Field of Search .................... 385/88, 89, 90, 385/91, 92, 93, 94, 37, 136

[56] References Cited

U.S. PATENT DOCUMENTS

| | | | |
|---|---|---|---|
| 4,786,132 | 11/1988 | Gordon | 350/96.19 |
| 5,430,820 | 7/1995 | van Tongeren et al. | 385/94 |
| 5,619,609 | 4/1997 | Pan et al. | 385/136 |
| 5,717,804 | 2/1998 | Pan et al. | 385/94 |
| 5,812,716 | 9/1998 | Ohishi | 385/92 |

OTHER PUBLICATIONS

Yoffe, G.W., "Passive Temperature–Compensating Package for Optical Fiber Gratings," *Applied Optics*, vol. 34, No. 30, pp. 6859–6861 (Oct. 10, 1995).

*Primary Examiner*—Phan T. H. Palmer
*Attorney, Agent, or Firm*—Townsend and Townsend and Crew LLP

[57] ABSTRACT

A laser diode package assembly is described. Besides a laser diode, the package assembly has an optical fiber section having an end located to receive the light output from the laser diode. The optical fiber section also has a fiber grating designed to operate as a bandpass filter. The fiber grating inside the package assembly not only narrows the output wavelength from the laser diode, but also increases the lifetime of the laser diode.

10 Claims, 4 Drawing Sheets

INTEGRATED LASER DIODE AND FIBER GRATING ASSEMBLY

This application is a continuation of, and claims priority from and the benefit of U.S. patent application Ser. No. 08/640,375, filed Apr. 2, 1997, now U.S. Pat. No. 5,717,804 the disclosure of which is incorporated by reference.

BACKGROUND OF THE INVENTION

The present invention relates to fiberoptic network devices and, more particularly, to laser source assemblies.

In fiber optics, lasers provide the only practical source of light signals for the optical fibers. In a fiberoptic network, semiconductor lasers are used as sources for the light signals of the network. The sources are typically formed from a laser diode chip which is mounted in a hermetically sealed package.

Recently some fiberoptic device manufacturers have attached a fiber grating to the output fiber of laser diode packages. The fiber grating narrows the linewidth of the laser diode output. Sources with narrow linewidths are desirable in certain applications, such as for WDM (Wavelength Division Multiplexing) networks. A particularly suitable application is the stabilization of pumping sources of EDFA's (erbium-doped fiber amplifiers) for high gain conversion efficiency and gain stability. However, the inventors of the present invention have determined problems with this arrangement, including adverse effects upon the lifetime of the laser diode.

The present invention solves or substantially mitigates these problems.

SUMMARY OF THE INVENTION

The present invention provides for a laser source assembly which has a hermetically sealable package, a laser diode mounted in the package, an optical fiber section mounted in the package, and a fiber grating in the package and connected to the optical fiber section so that light output from the laser diode transits the fiber grating. The optical fiber section has an end proximate the laser diode to receive light output from the laser diode. Furthermore, the present invention contemplates forming the fiber grating as part of the optical fiber section.

DETAILED DESCRIPTION OF PREFERRED EMBODIMENT(S)

Figure 1:
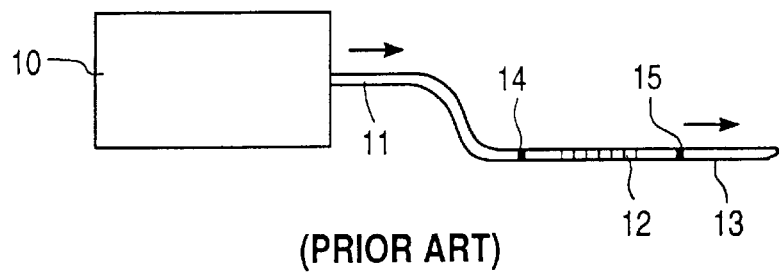
FIG. 1 is a representational diagram of a combination of a laser diode package connected to a fiber grating according to the prior art.

FIG. 1 illustrates a typical laser diode package 10 with an output fiber 11. To narrow the linewidth of the laser diode's output, a fiber grating 12 may be connected to the output fiber 11. A fiber grating or, more precisely, a fiber Bragg grating, is created by a periodic change in the effective refractive index of an optical fiber. In the drawing, connections between optical fibers, such as the connection 14 between the output fiber 11 and the fiber grating 12 (or, more precisely, the optical fiber containing the periodic change in the effective refractive index), is shown by heavy marks. By a connection 15, the fiber grating 12 is connected to an optical fiber 13 which leads to a receiver of the output from the laser diode in the package 10.

The fiber grating 12, designed as a band-pass filter, allows light in a narrow range to pass through the grating, while reflecting back light which is outside the range. This arrangement has the benefit that the linewidth of the laser output signal is narrowed considerably after passing through the fiber grating 12. For example, the number of channels in a WDM fiberoptic network is increased with light signal sources of narrowed linewidth.

However, the inventors of the present invention have observed a subtle problem with this arrangement. The fiber grating 12 reflects much of the light from the laser diode of the laser package 10 back into the laser diode. The output fiber 11 between the laser diode package 10 and the fiber grating 12 is flexible. If the fiber 11 is twisted or bent, the polarization of the laser's output light is changed. The changed polarization of the reflected light adversely affects dP/dI, where P is the output power of the laser diode and I is the current through the laser diode, and ultimately, the lifetime of the laser diode.

Figure 2A:
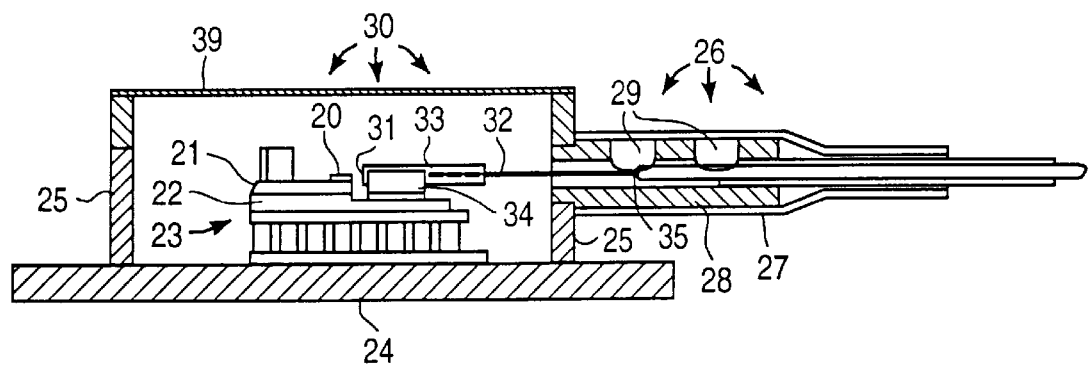
FIG. 2A is a cross-sectional side view of the integrated laser diode and fiber grating assembly according to an embodiment of the present invention.
Figure 2B:
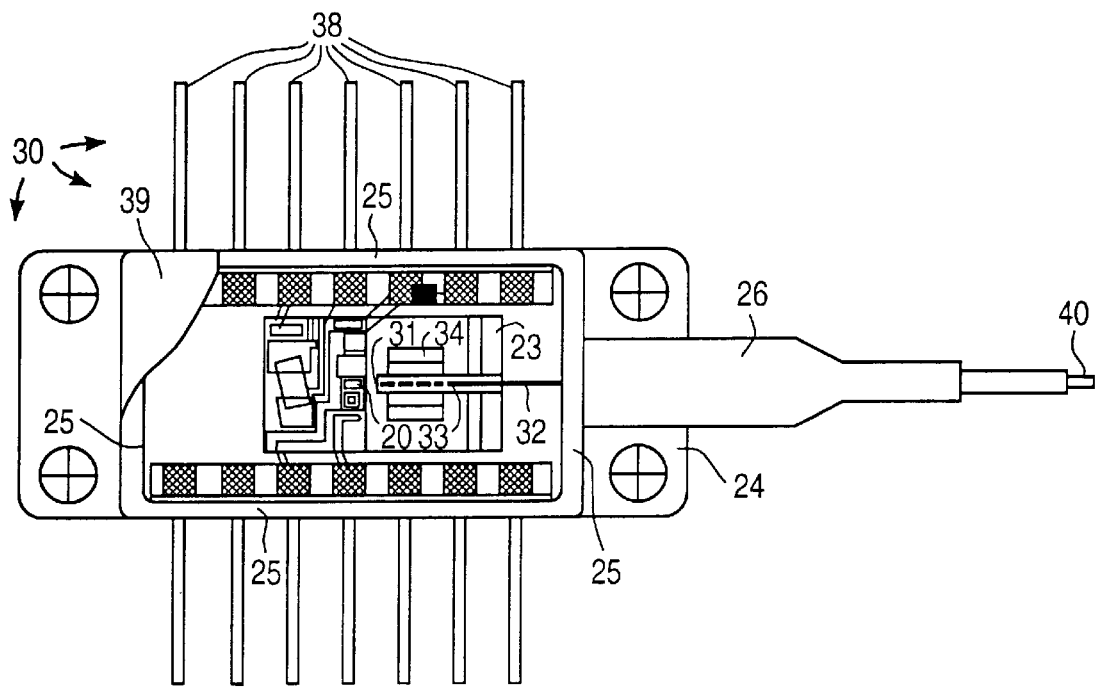
FIG. 2B is a partial cutaway top view of the assembly of FIG. 2A.

In accordance with the present invention, the fiber grating is brought into a laser diode package and is formed as part of a section of an optical fiber in the package. As shown in FIGS. 2A and 2B, a package 30, here shown as a so-called butterfly package, has a base plate 24, sidewalls 25 and a lid 39. Leads 38 provide electrical connections into the package 30 and a fiber holding fixture 26 secures an output fiber 40.

Inside the package 30, laser diode semiconductor chip 20 is fixed to a base 21 which, in turn, is fixed to a heat sink 22. The heat sink 22 is mounted to one side of a thermoelectric cooler 23. The other side of the thermoelectric cooler unit 23 is fixed to a base 24 of the laser diode package 30. Each side of the thermoelectric cooler unit is a thermally conducting plate on either side of several semiconductor chips, which are electrically connected in series. An electric current through the semiconductor chips transfers thermal energy from one side of the thermoelectric cooler unit 23 to the other. The electrical connections to the thermoelectric cooler unit 23 and the laser diode chip 20 are made through the leads 38.

An end 31 of an optical fiber section 32 is placed near the output of the laser diode chip 20. The end 31 has a microlens so as to focus as much light as possible from the laser chip 20 into the core of the optical fiber section 32. The optical fiber section 32 is unjacketed and the cladding near the end 31 is covered by a cylindrical metal layer 33. The metal layer 33 is laser-welded to a fiber clip 34 which is also fixed to the heat sink 22. This arrangement holds the end 31 securely in place near the laser diode chip, as desired.

The fiber clip 34 can be designed in various ways. However, the fiber clip which is disclosed in a separate patent application entitled "FIBEROPTIC SUPPORT CLIP", U.S. patent application Ser. No. 08/597,449, filed Feb. 2, 1996 now U.S. Pat. No. 5,619,609 by J. J. Pan, Paul Shi-Qi Jiang, Ming Shih, Jian Chen, and Li-Hua Wang, and assigned to the present assignee, has been found to be very effective.

Figure 3:
FIG. 3 is a representational view of the optical fiber section in the integrated laser diode and fiber grating assembly of FIGS. 2A and 2B.

FIG. 3 is a representational view of the optical fiber section 32 from the end 31 with its microlens and a fiber grating 51.

The microlens is formed by first cleaving an optical fiber from which the optical fiber section 32 is to be formed as perpendicularly as possible to the longitudinal axis of the optical fiber. A second optical fiber also has its tip cleaved as perpendicularly as possible. The two fiber ends are brought together in the discharge between two electric arc electrodes. After the two ends are fused together, the optical fiber section 32 is slowly drawn away from the second fiber, which is kept stationary. The rate at which the fiber section 32 is drawn away from the second fiber is determined empirically in conjunction with the strength of the arc discharge between the electrodes.

The heated end of the fiber section 32 becomes thinner the longer the fiber is drawn away from the second fiber. Thus, the drawing of the fiber section 32 determines the diameter and the radius of curvature of the microlens which is to be formed at the tip of the fiber section 32. In drawing the fiber section 32, the core of the fiber section 32 should not twisted. Otherwise, the resulting microlens with its twisted core does not function properly.

Figure 4:
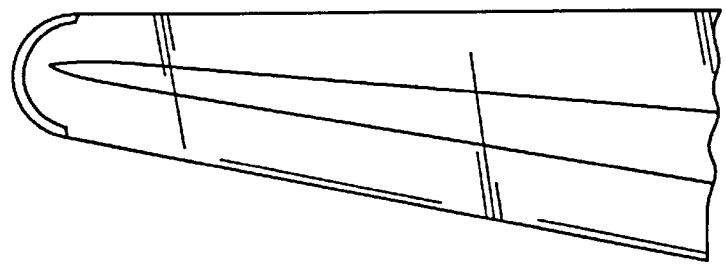
FIG. 4 is a detailed view of the microlens at one end of the optical fiber section in the integrated laser diode and fiber grating assembly of FIGS. 2A and 2B.

When the desired diameter is reached, a quick pull or jerk separates the fiber section 32 from the second fiber. The resulting tip of the fiber section 32 is left in the discharge of the electrodes for a short time to allow the tip round itself under surface tension. The tip is then withdrawn from the arc discharge. The completed microlens is shown in FIG. 4.

Away from the end 31, the fiber Bragg grating 51 is created in the core of the section 32. With a uniformly sinusoidal fiber Bragg grating, a precise and narrow wavelength reflection band is created by the fiber grating. This fiber Bragg grating is designed so that the reflection band is partial, i.e., only a fraction of the light from the laser diode is reflected back. The reflected light increases the output of the laser diode at this wavelength band and correspondingly decreases the output outside the wavelength band. For optimum performance, it has been found that the fraction of light reflected by the fiber Bragg grating varies according to the manufacturer of the laser diode, but in all cases, the fraction should be less than 0.09, i.e., less than 9% reflectivity.

Figure 5:
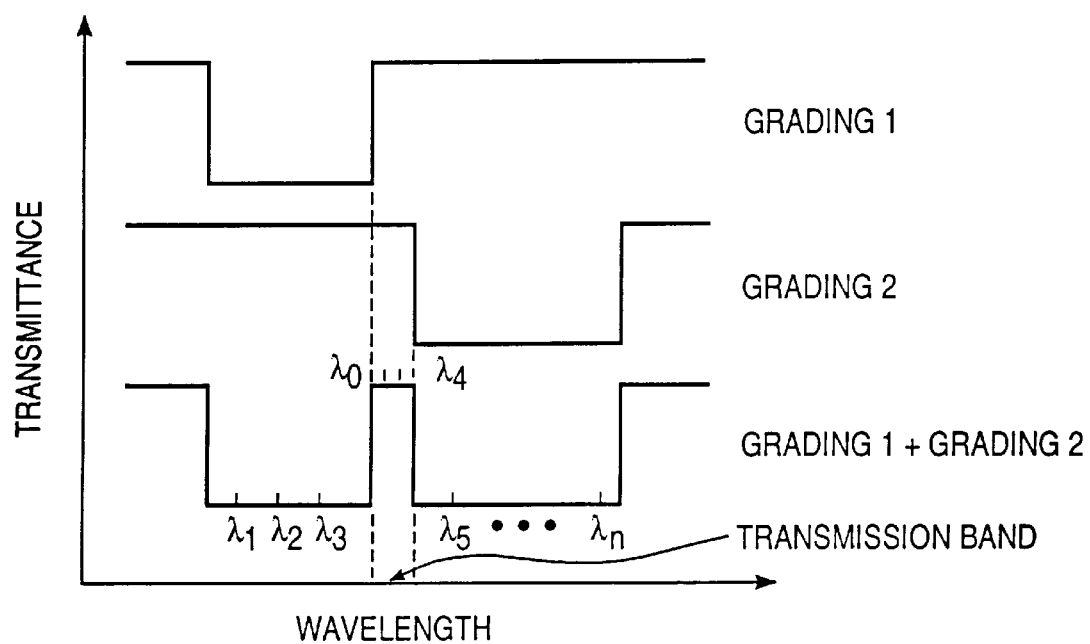
FIG. 5 is a graph of wavelength versus transmittance for the fiber gratings in the optical fiber section of the assembly in FIGS. 2A and 2B.

Alternatively, the fiber grating 51 is formed by two fiber (Bragg) gratings which operate as a bandpass filter. As stated previously, a uniformly sinusoidal fiber Bragg grating has a precise and narrow wavelength band in which light is reflected by the fiber grating. Light outside the band is transmitted through the fiber grating. There are two techniques to widen the reflection band. The fiber grating may be linearly chirped, i.e., the periodicity of the fiber grating can be linearly varied. Alternatively, the fiber grating is created from a cascade of uniform fiber gratings, the reflection band of each uniform fiber grating contiguous with each other. The two fiber Bragg gratings have such a widened reflection range. Each grating has a slightly different wavelength range as illustrated in FIG. 5, which plots transmittance, the inverse of reflectance, versus wavelength for both gratings. The combination of the two gratings in series in the optical fiber section 32 transmits light in a very narrow range (band), so that the optical fiber section 32 now includes a high-performance bandpass filter. Light outside of the narrow range from the laser diode chip 20 is reflected. Only light in the very narrow range passes out from the laser diode assembly 30.

Figure 7:
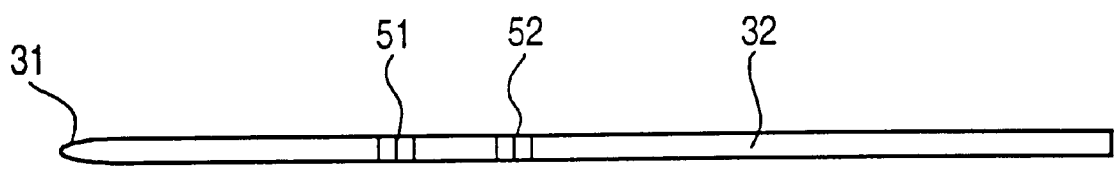
FIG. 7 is a representation of the optical fiber section with two fiber Bragg gratings.

The optical fiber section 32 is formed from a single mode optical fiber having a core diameter of approximately $10\mu$. The entire section 32 is approximately 15 mm long, which is sufficiently small to fit the section 32 into the laser diode assembly. The fiber gratings 51 and 52, as represented in FIG. 7, are formed in a portion of the optical fiber section 32 approximately 6 mm long. From the end 31 near the diode 20, the optical fiber section 32 extends through one of the sidewalls 25 of the package assembly 30 to the fiber holding fixture 26.

The fixture 26 has a metal barrel 28 with a central longitudinal opening for holding optical fibers. The metal barrel also has side openings 29 to access the optical fibers in the central opening. When assembly is complete, heat-shrunk tubing 26 over the barrel 28 and openings 29 protects the internal elements of the fixture 26. The optical fiber section 32 has an end 35 in the fixture 26. This end 35 is laser-fused to an end of the output optical fiber 40 which is a single-mode fiber, at one of the side openings 29.

Upon completion, the package assembly is hermetically sealed. In passing, it should be noted that some elements in the package assembly, particularly those shown in the top view of FIG. 2B, have not been described. Only the elements of the assembly which are pertinent to the present invention have been disclosed.

Figure 6A:
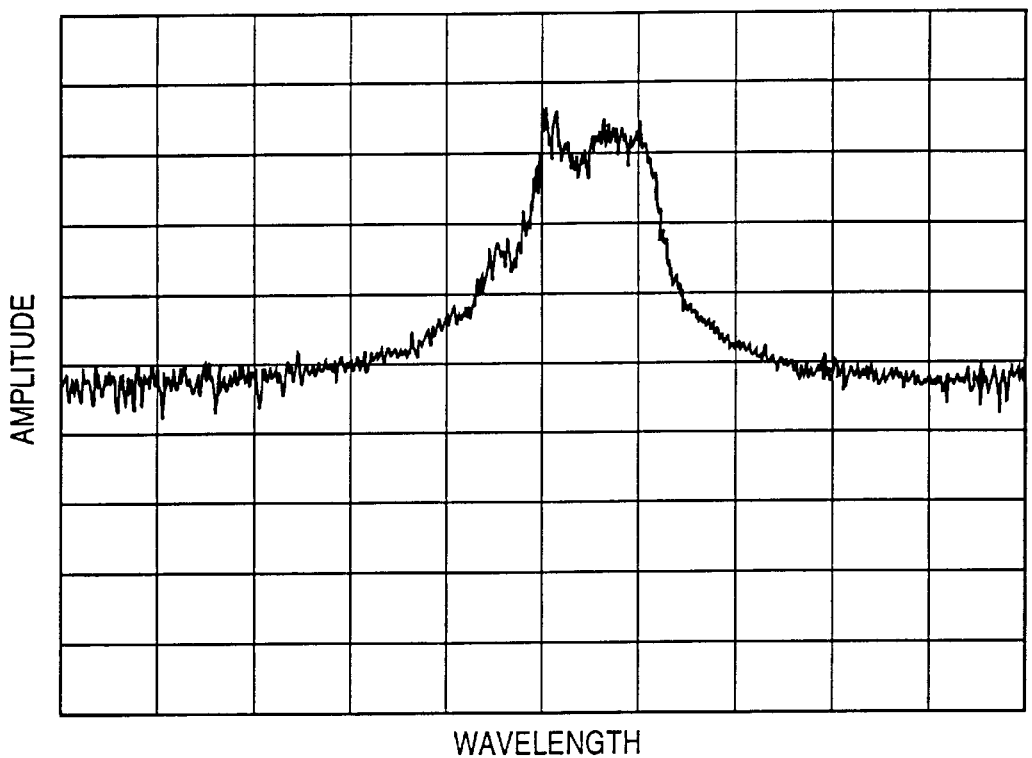
FIG. 6A is a plot of the output signal amplitude versus wavelength for a laser diode package without a fiber grating.
Figure 6B:
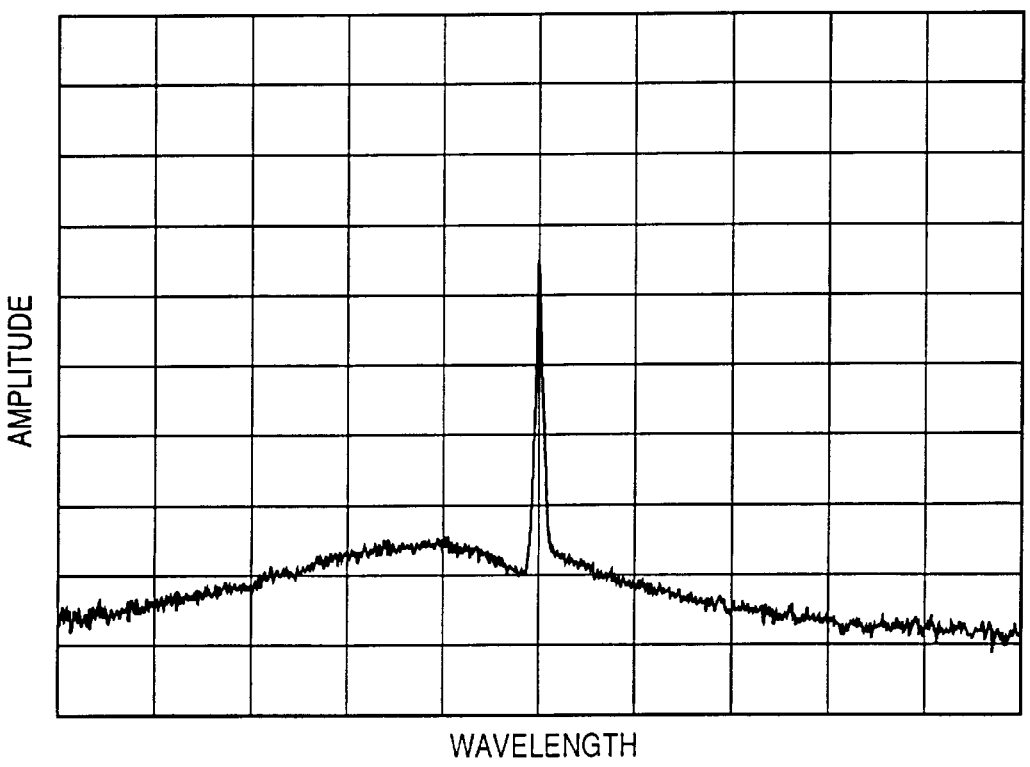
FIG. 6B is a plot of the output signal amplitude versus wavelength for the assembly of FIGS. 2A and 2B.

FIGS. 6A and 6B illustrate the comparative performance of the present invention. FIG. 6A shows the output of the laser diode chip without an optical fiber section with a fiber grating. The maximum output from the laser diode is spread over a range of wavelengths around approximately 980 nm, a common output wavelength for laser diodes. FIG. 6B shows the output of a package assembly like that in FIGS. 2A and 2B. the output wavelength is narrowed considerably and the output is smoother than that shown in FIG. 6A.

Besides prolonging the lifetime of the laser diode, it is believed the present invention further enhances the output from the laser diode compared to an arrangement with the fiber grating outside the laser diode package. When the fiber grating is placed inside the protective confines of the laser diode package, the fiber grating is maintained at approximately 25° C. by the thermoelectric cooler unit 23. The constant temperature helps the fiber grating to maintain its function at a constant performance level.

While the above is a complete description of the preferred embodiments of the present invention, various alternatives, modifications and equivalents may be used. It should be evident that the present invention is equally applicable by making appropriate modifications to the embodiment described above. Therefore, the above description should not be taken as limiting the scope of invention which is defined by the metes and bounds of the appended claims.

What is claimed is:

1. A fiberoptic signal transmission method comprising:

generating a laser light signal from a laser diode in a hermetically sealable package;

directing the signal toward an optical fiber section within the package so that the signal enters the optical fiber; and transiting the signal from the laser diode through a fiber Bragg grating of the optical fiber within the package.

2. The method of claim 1, wherein the directing step is performed by a microlens of the optical fiber, the microlens disposed at an end of the fiber proximate the laser diode so that the microlens focusses the signal into a core of the optical fiber.

3. The method of claim 2, wherein the core of the optical fiber has a diameter of approximately 10 $\mu$m.

4. The method of claim 1, wherein the transiting step selectively passes the signals in a narrow transmission band out of the package.

5. The method of claim 4, wherein the fiber Bragg grating includes two fiber Bragg gratings of widened reflection ranges, each widened reflection range differing from the other so as to define the narrow transmission band.

6. The method of claim 1, wherein the transiting step is performed by connecting the fiber Bragg grating to the optical fiber.

7. The method of claim 1, wherein the transiting step is performed by forming the fiber Bragg grating as part of the optical fiber.

8. The method of claim 1, wherein the transiting step reflects less than 9% of the signal.

9. The method of claim 1, wherein the optical fiber section comprises a single mode fiber.

10. A method for fabricating a low-noise laser source assembly, the method comprising:

mounting a laser diode within a hermetically sealable package;

mounting an optical fiber section within the package so that the optical fiber has an end proximate the laser diode to receive a laser light signal from the laser diode; and sealing the package so that the signal transits a fiber Bragg grating before passing out of the package.

* * * * *